United States Patent
Umai et al.

(10) Patent No.: US 8,369,472 B2
(45) Date of Patent: Feb. 5, 2013

(54) SEMICONDUCTOR INTEGRATED CIRCUIT DEVICE AND METHOD FOR CLOCK DATA RECOVERY

(75) Inventors: Seiichi Umai, Higashiyamato (JP); Takeshi Isezaki, Ome (JP)

(73) Assignee: Hitachi, Ltd., Tokyo (JP)

( * ) Notice: Subject to any disclaimer, the term of this patent is extended or adjusted under 35 U.S.C. 154(b) by 1066 days.

(21) Appl. No.: 12/349,560

(22) Filed: Jan. 7, 2009

(65) Prior Publication Data
US 2009/0245449 A1 Oct. 1, 2009

(30) Foreign Application Priority Data
Mar. 28, 2008 (JP) .................................. 2008-085174

(51) Int. Cl.
*H04L 7/00* (2006.01)
(52) U.S. Cl. .......................................... 375/355; 375/354
(58) Field of Classification Search ................... 375/355
See application file for complete search history.

(56) References Cited

U.S. PATENT DOCUMENTS

| 8,036,300 B2 * | 10/2011 | Evans et al. ................... 375/276 |
| 2004/0114632 A1 | 6/2004 | Yuuki et al. |
| 2007/0047683 A1 | 3/2007 | Okamura et al. |
| 2007/0058768 A1 * | 3/2007 | Werner ......................... 375/376 |
| 2007/0073943 A1 | 3/2007 | Saeki et al. |

FOREIGN PATENT DOCUMENTS

| JP | 2004-180188 A | 6/2004 |
| JP | 2007-36869 A | 2/2007 |
| JP | 2007-060652 | 3/2007 |

OTHER PUBLICATIONS

English translation of Office Action issued May 31, 2012, in Japanese Patent Application No. 2008-085174.

* cited by examiner

*Primary Examiner* — Erin M. File
(74) *Attorney, Agent, or Firm* — Miles & Stockbridge P.C.

(57) ABSTRACT

A clock data recovery circuit of an interpolator type capable of corresponding to multi-rate data without increasing the bandwidth of the interpolator. A clock generated by an interpolator is divided to generate a recovery clock. A pointer that controls the phase of the clock generated by the interpolator uses the clock before division, and the other circuits are operated by the recovery clock after division.

6 Claims, 7 Drawing Sheets

SEMICONDUCTOR INTEGRATED CIRCUIT DEVICE AND METHOD FOR CLOCK DATA RECOVERY

CLAIM OF PRIORITY

The present application claims priority from Japanese patent application JP 2008-085174 filed on Mar. 28, 2008, the content of which is hereby incorporated by reference into this application.

FIELD OF THE INVENTION

The present invention relates to a clock data recovery circuit that receives multi-rate serial data, and more particular, to a clock data recovery circuit applicable for a serializer/de-serializer circuit (Serdes).

BACKGROUND OF THE INVENTION

In recent years, serial data transmission has been used for various fields, such as optical communication (PON: passive optical network) shown in FIG. 1, and backplane transmission of a personal computer (PC) or a server, and there is a demand for an increase in the transmission speed of serial data with an increase in the amount of information treated. In order to transmit serial data at a high speed, a clock data recovery circuit (CDR) that extracts phase information from the transmitted serial data and generates a clock in synchronization with data is needed. In addition, various protocols, such as GPON, are used to transmit serial data at a high speed, and they have predetermined transmission rates. In addition, the same protocol, such as Ethernet, may have plural transmission rates. Therefore, in order to standardize a protocol using one LSI, a clock data recovery circuit corresponding to a multi-rate is needed.

JP-A-2007-36869 discloses a serializer/de-serializer circuit (Serdes) including a clock data recovery circuit. The Serdes circuit includes a general clock data recovery circuit, and a parallel-serial conversion circuit, a serial-parallel conversion circuit, and a FIFO (first in first out) circuit are integrated, thereby reducing the size and the power consumption of the circuit.

Figure 6:
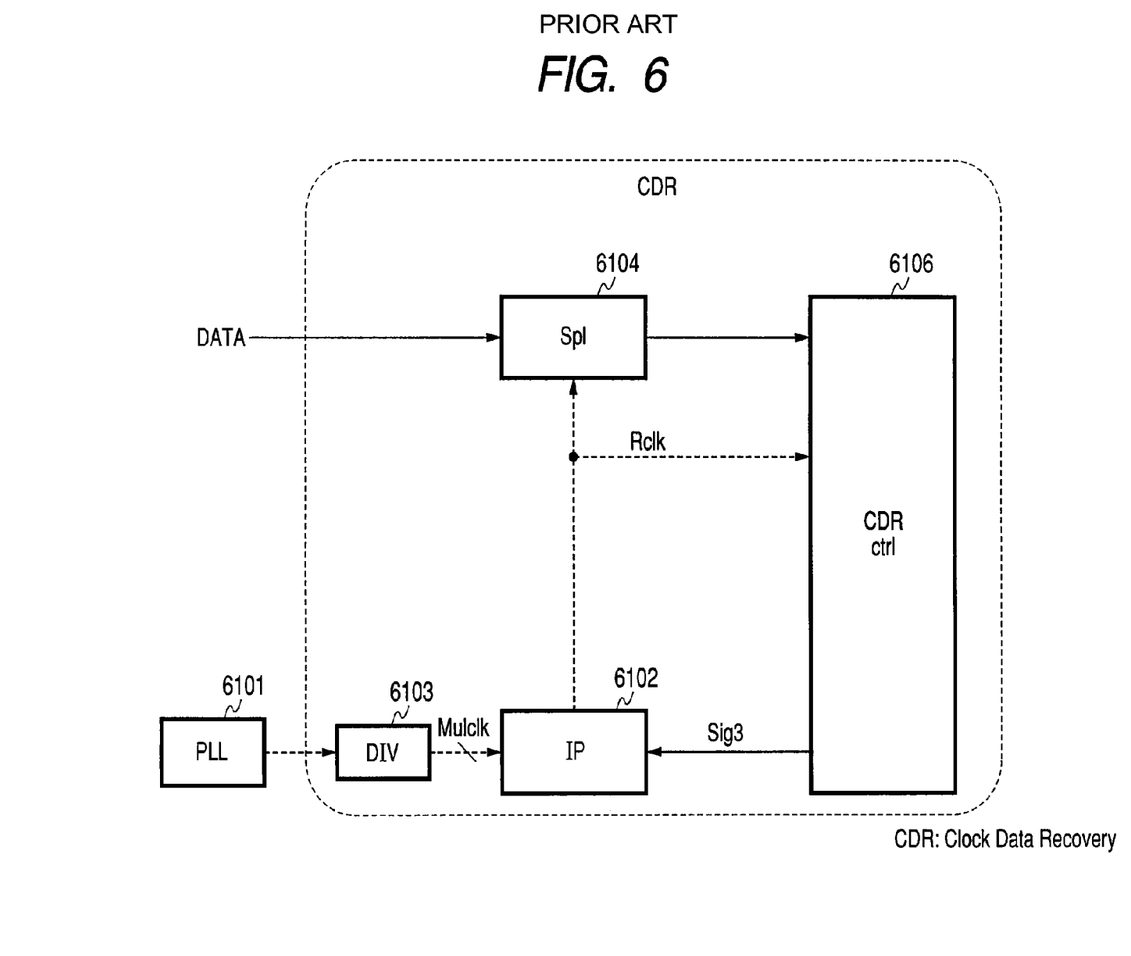
FIG. 6 is a block diagram illustrating a clock data recovery circuit included in a serializer/de-serializer circuit (Serdes) shown in FIG. 7 in JP-A-2007-36869.
Figure 7A:
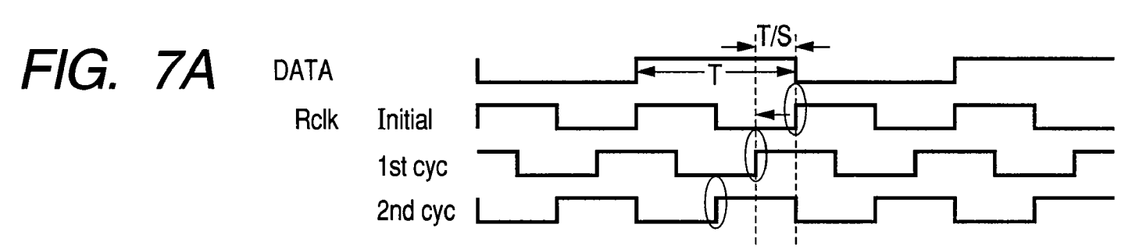
FIG. 7 is a diagram illustrating the waveforms of input data and a recovery clock of the clock data recovery circuit corresponding to a multi-rate. Specifically, in FIG. 7, (a) shows the waveforms when the rate of the input data is the highest, (b) shows the waveforms when the data rate is 1/N (when a correction amount is T/S), (c) shows the waveforms when the data rate is 1/N (when a correction amount is N×T/S), and (d) shows the expected waveforms when the data rate is 1/N.
Figure 7B:
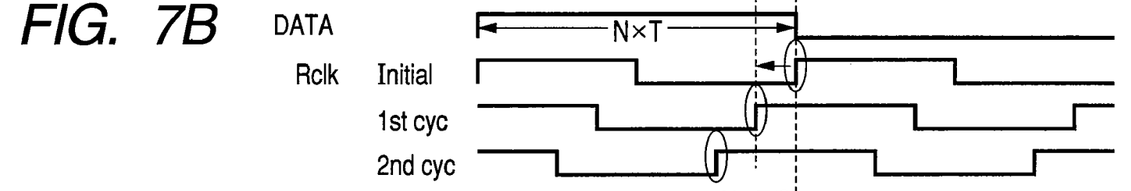
Figure 7C:
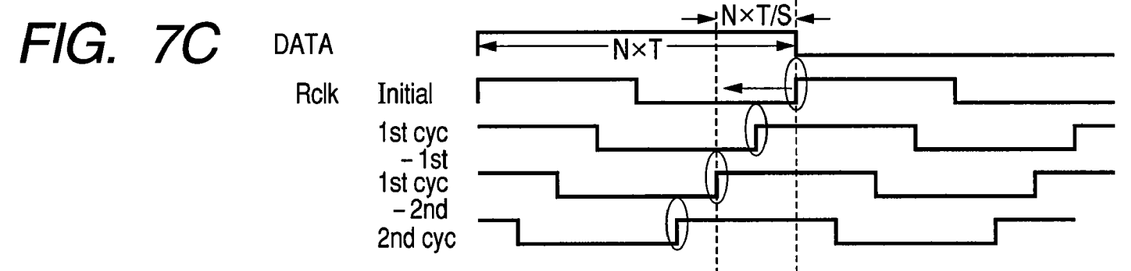
Figure 7D:
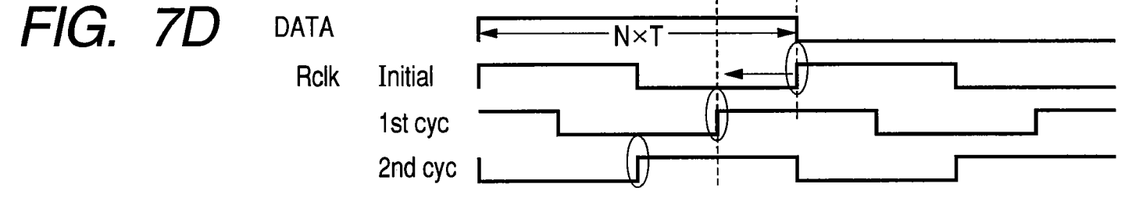

FIG. 6 is a diagram illustrating a clock data recovery circuit (CDR) included in the serializer/de-serializer circuit (Serdes) shown in FIG. 7 in JP-A-2007-36869. FIG. 6 shows a phase-locked loop 6101 (PLL), a divider 6103, an interpolator 6102 (IP), a sampling circuit 6104 (Spl), and a clock data recovery circuit controller 6106 (CDRctrl: CDR controller).

The divider 6103 (DIV) divides a clock generated by the phase-locked loop 6101 (PLL) into multi-phase clocks. The interpolator 6102 (IP) uses the multi-phase clocks to generate a recovery clock. The sampling circuit 6104 (Spl) compares input data with the recovery clock. The CDR controller 6106 controls the phase of the interpolator 6102 on the basis of the comparison result to generate a recovery clock that is most suitable for the input data.

In FIG. 6, it is possible to correspond to a multi-rate by changing the division ratio of the divider 6103 (DIV) provided between the phase-locked loop 6101 (PLL) and the interpolator 6102 (IP). However, in this method, it is necessary to change the operation speed of the interpolator 6102 (IP) according to the transmission rate of input data, and the interpolator 6102 (IP) needs to have a very large bandwidth. However, when the bandwidth of an analog circuit, such as the interpolator, is increased, jitter or a circuit size is increased.

SUMMARY OF THE INVENTION

The invention has been made in order to solve the above problems, and an object of the invention is to provide a clock data recovery circuit corresponding to multi-rate data without increasing the bandwidth of an interpolator.

The outline of a representative embodiment of the invention is briefly described as follows. An interpolator (IP) composes multi-phase clocks supplied from a clock source (PLL), such as a phase-locked loop (PLL), to generate a composite clock (Compclk), and a divider (DIV) divides the composite clock according to a data transmission rate to generate a recovery clock (Rclk) having a frequency that is most suitable to receive input data. A phase comparator (PhC) compares the phase of the recovery clock (Rclk) with the phase of input data to determine whether the phase of the clock lags or leads the phase of serial data. A filter (Fil) optimizes a phase determination result (Sig1), and a pointer (Pt) transmits a control signal (Sig3) for delaying or advancing the phase of a clock to the interpolator (IP) on the basis of the phase determination result. When receiving the control signal (Sig3), the interpolator delays or advances the phase of a clock generated. In this way, a clock data recovery circuit (CDR) corresponding to a multi-rate is achieved. In addition, different clocks are supplied to the phase comparator (PhC), the filter (Fil), and the pointer (Pt), and any one of (1) the composite clock of the interpolator, (2) a recovery clock, (3) a clock obtained by dividing the composite clock of the interpolator, and (4) a clock obtained by dividing the recovery clock is used to control the following characteristics of the clock data recovery circuit.

The effects of obtained by a representative embodiment of the invention are as follows. It is possible to achieve a clock data recovery circuit corresponding to multi-rate data without increasing the bandwidth of an interpolator.

BRIEF DESCRIPTION OF THE DRAWINGS

FIGS. 1A and 1B are diagrams illustrating high-speed serial transmission systems. Specifically.

DETAILED DESCRIPTION OF THE PREFERRED EMBODIMENTS

Figure 1A:
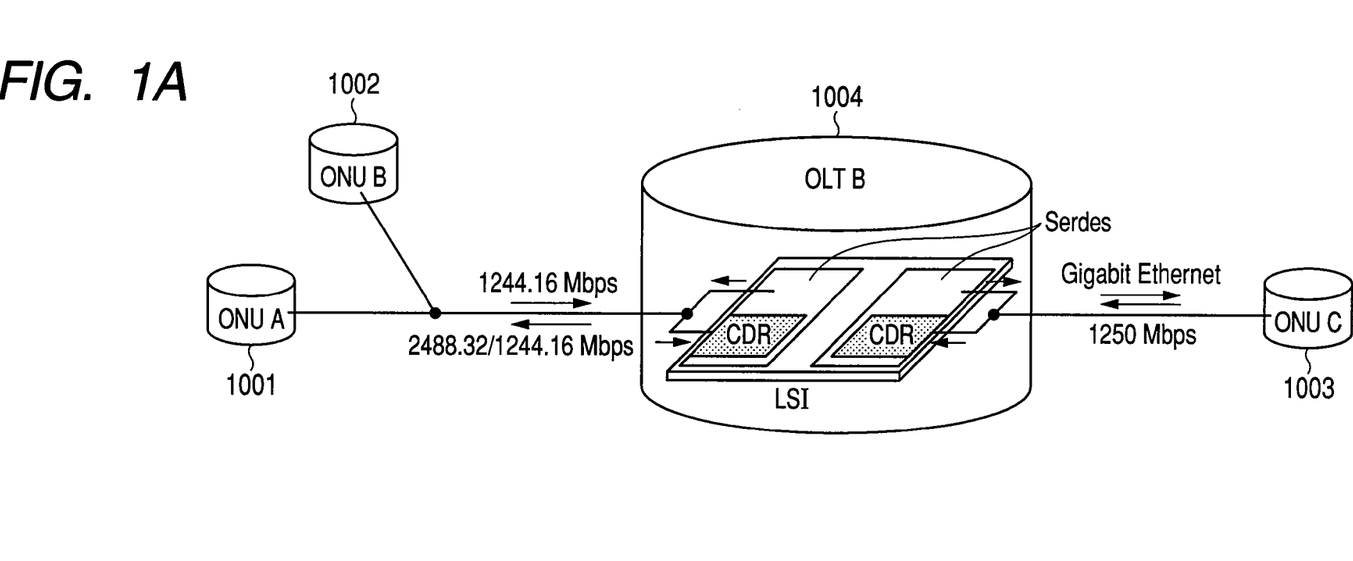
FIG. 1A is a diagram illustrating a PON, which is an optical communication system.

FIGS. 1A and 1B are diagrams illustrating examples of high-speed serial transmission systems. FIG. 1A is a diagram illustrating a passive optical network (PON), which is an optical communication network system.

The PON includes plural ONUs (optical network units) 1001 to 1003, which are terminal-side transceivers, an optical line terminal (OLT) 1004, which is a base-station-side transceiver, and optical fibers connecting the units.

The ONU is a communication apparatus that is connected to a personal computer (PC) installed in, for example, the home and performs data communication with the OLT.

The OLT is a communication apparatus that is installed in, for example, a base station of an Internet service provider and is connected to plural ONUs by the optical fibers to perform data communication between the Internet and the ONUs. There is a protocol, such as a gigabit PON (GPON) or a gigabit Ethernet PON, in the communication between the ONUs and the OLT, and these protocols have different data transmission rates.

Figure 1B:
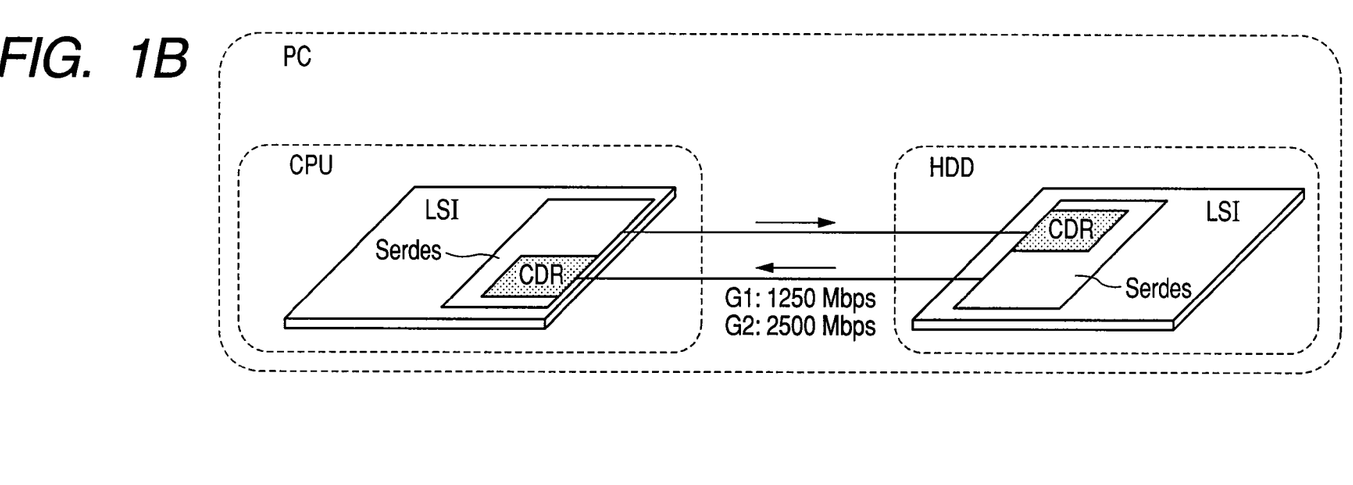
FIG. 1B is a diagram illustrating communication between a CPU and an HDD in a PC.

FIG. 1B is a diagram illustrating communication between a central processing unit (CPU) and a hard disk drive (HDD) in a PC. The central processing unit (CPU) is a semiconductor device that reads out data stored in the hard disk drive, which is a storage device, if necessary, performs an operation in response to instructions from the user, and writes the operation results in the hard disk drive, if necessary. The hard disk drive (HDD) is a storage device that is provided in a digital apparatus, such as a PC, includes a non-volatile magnetic recording disk, a magnetic recording head that reads and writes data, and a controller that controls the magnetic recording head performing data exchange with an external device, and can store a large amount of data. The communication between the CPU and the HDD is defined by a predetermined protocol. In the protocol, there are generation 1 (G1) and generation 2 (G2) having different transmission rates and requiring compatibility therebetween. Therefore, transmitting and receiving circuits need to transmit data of the generations 1 and 2.

In FIGS. 1A and 1B, high-speed communication is performed, and a receiving large-scale integrated circuit (LSI) or integrated circuit (IC) is provided in a receiver. Therefore, a clock data recovery circuit (CDR) that generates a clock (recovery clock) in synchronization with received data needs to be provided in the LSI or the IC.

Figure 2:
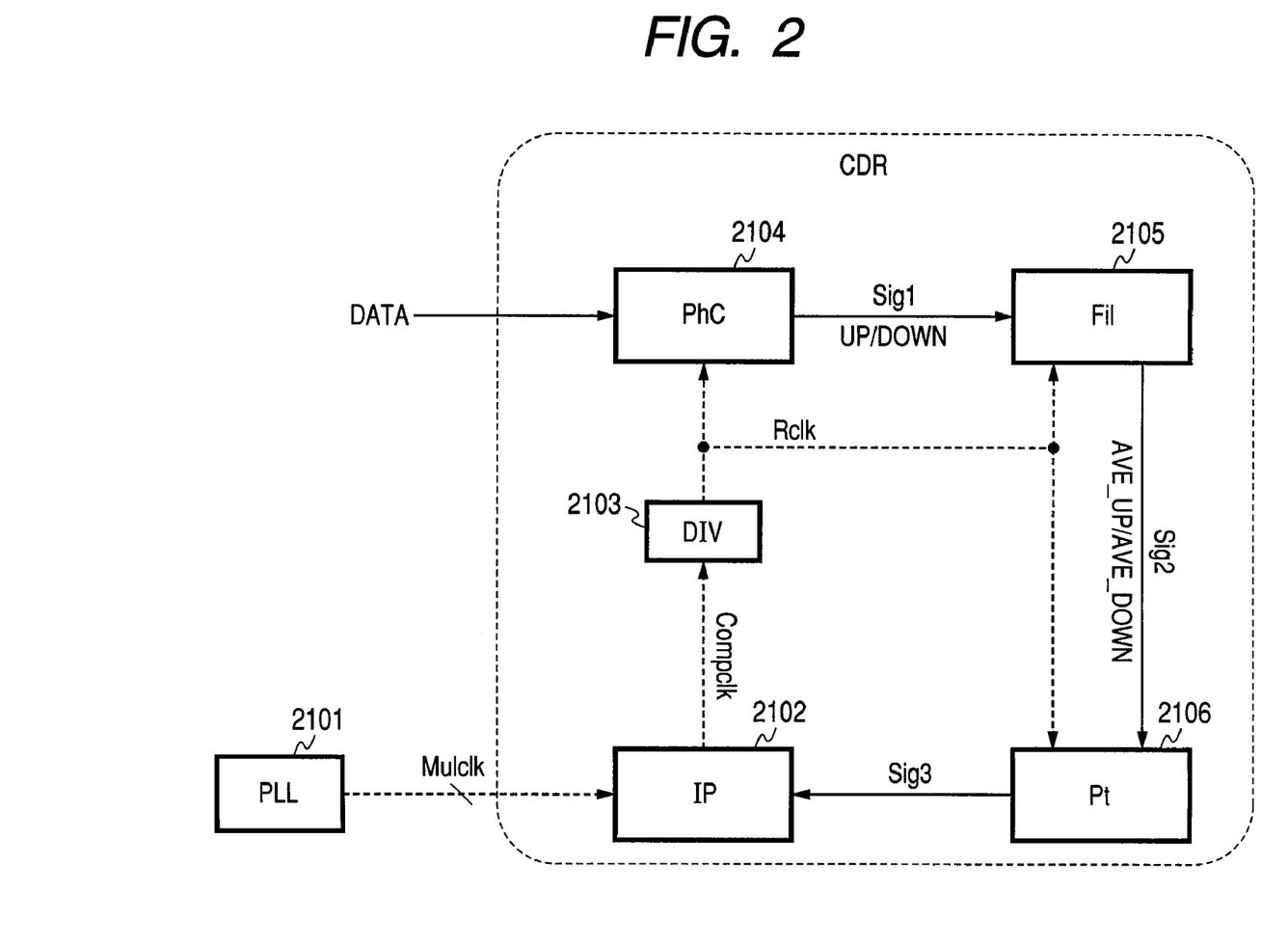
FIG. 2 is a diagram illustrating an example of a clock data recovery circuit corresponding to a multi-rate.

FIG. 2 is a block diagram illustrating the details of the clock data recovery circuit (CDR) shown in FIG. 1. The circuit shown in FIG. 2 includes a phase-locked loop 2101 (PLL), an interpolator 2102 (IP), a divider 2103 (DIV), a phase comparator 2104 (PhC), a filter 2105 (Fil), and a pointer 2106 (Pt).

The phase-locked loop 2101 (PLL) includes plural inverters that output "0" when input data is "1" and a ring oscillator, and extracts the outputs of the plural inverters as clocks to generate multi-phase clocks (Mulclk) having the same frequency and different phases.

The interpolator 2102 (IP) gives a weight to plural multi-phase clocks having the same frequency and different phases supplied from the phase-locked loop 2101 (PLL) and adds the multi-clocks to generate a composite clock (Compclk) for compensating the phase difference between the multi-phase clocks. The composite clock is used to change the weight, and is obtained by giving a phase difference of 1/S of one period (S is determined by the phase accuracy of a circuit and has a positive integer). The interpolator 2102 (IP) can change the weight in response to a control signal from the outside to generate a clock having an arbitrary phase (one phase to S phases).

The divider 2103 (DIV) converts (divides) an input clock at a frequency of 1/N to generate a recovery clock (Rclk). The division ratio N may be changed in response to a control signal from the outside.

The phase comparator 2104 (PhC) compares the phase (switching edge) of input data with the phase of the clock generated in the circuit to determine whether the phase of the clock leads or lags the phase of the input data, and outputs a phase comparison result.

The filter 2105 (Fil) accumulates the phase comparison results output from the phase comparator 2104 (PhC) for plural cycles, averages the phase comparison results, compares the average with a threshold value, determines whether to advance or delay the phase of the interpolator 2102 (IP), and outputs a phase update signal. In addition, the filter 2105 (Fil) controls the cycles (phase update cycle) for which the phase comparison results are accumulated to control the response speed of the phase control of the recovery clock with respect to the input data, and controls the overall bandwidth of the clock data recovery circuit.

The pointer 2106 (Pt) updates information associated with the phase (one phase to S phases) of the composite clock of the interpolator, in response to the phase update signal from the filter 2105 (Fil), and selects any one of the TAP signals (TAP1 to TAPS) associated with the phase (one phase to S phases) of the composite clock of the interpolator to control the phase of the composite clock of the interpolator 2102 (IP).

In the clock data recovery circuit, when the phase of a data receiving clock (recovery clock) during the reception of data is greatly changed, the reception of data may fail. Therefore, the pointer 2106 (Pt) advances or delays the phase of the composite clock of the interpolator 2102 (IP) by one level, which is referred as incremental control.

The phase comparator 2104 (PhC), the filter 2105 (Fil), and the pointer 2106 (Pt) operate using the recovery clock as an operation clock. The term 'operating using the recovery clock as an operation clock' means that a flip-flop in the circuit operates in synchronization with the recovery clock.

For better understanding, the operation principle of the clock data recovery circuit (CDR) under the following conditions will be described below:

A clock data recovery circuit (CDR) of a full rate type in which a maximum input data transmission rate is equal to the rate of the recovery clock (for example, when a data rate is 1 gigabit/sec, the recovery clock is 1 GHz);

The transmission rate is optimized when the transmission rate of input data is equal to that of the composite clock of the interpolator; and The maximum transmission rate of input data is set to 1, and the transmission rate is 1/N (0<N<infinite).

The interpolator 2102 (IP) uses the multi-phase clocks supplied from the phase-locked loop 2101 (PLL) to generate composite clocks having the same frequency and different phases. In addition, it is possible to incrementally advance or delay the phase of the composite clock at an interval of 1/S of one period (S is determined by the phase accuracy of a circuit and has a positive integer) using a control signal from the pointer 2106 (Pt).

The interpolator 2102 (IP) operates at the highest transmission rate of input data and outputs a clock having a period T all the time even when the transmission rate of the input data is changed. Therefore, when the transmission rate of the input data is 1/N, the divider 2103 divides the composite clock by N to generate a recovery clock and supplies the recovery clock. The phase comparator 2104 (PhC) compares the phase of the input data and the phase of the recovery clock, and outputs a phase comparison result signal (Sig1). When the recovery clock lags the input data in phase, the phase comparator outputs a phase delay signal (UP signal) indicating that the recovery clock lags the input data in phase as the phase comparison result signal (Sig1). On the other hand, when the recovery clock leads the input data in phase, the phase comparator outputs a phase advance signal (DOWN signal) indicating that the recovery clock leads the input data in phase as the phase comparison result signal (Sig1).

The filter 2105 (Fil) counts the numbers of times the phase delay signal and the phase advance signal (UP and DOWN signals) are asserted for plural cycles using a counter, compares a difference (UP-DOWN) between the count values of the phase delay signal and the phase advance signal (UP and DOWN signals) with a predetermined threshold value, and outputs a phase advance signal (AVE_UP) as a phase update signal (Sig2) when the difference is a positive value and is larger than a positive threshold value. In addition, the filter compares the difference between the count values with the threshold value, and outputs a phase delay signal (AVE_DOWN) as the phase update signal (Sig2) when the difference is a negative value and is smaller than a positive threshold value.

The pointer 2106 (Pt) receives the phase update signal (Sig2), and outputs a phase advance signal or a phase control signal (Sig3) for phase delay to the interpolator 2102 (Pt) to control the phase of the composite clock of the interpolator 2102 (Pt).

The series of operations are repeatedly performed to generate a recovery clock having a frequency and a phase that are most suitable to receive multi-rate input data. In the clock data recovery circuit, the interpolator having a limited bandwidth is operated at the same speed all the time to generate the composite clock, and the divider divides the composite clock into a recovery clock with an optimal frequency. Therefore, there is no limitation in the bandwidth of a transmission rate that is lower than the operation speed of the interpolator, and it is possible to receive any data regardless of a protocol. It is possible to receive serial data having any transmission rate using one LSI.

Figure 3:
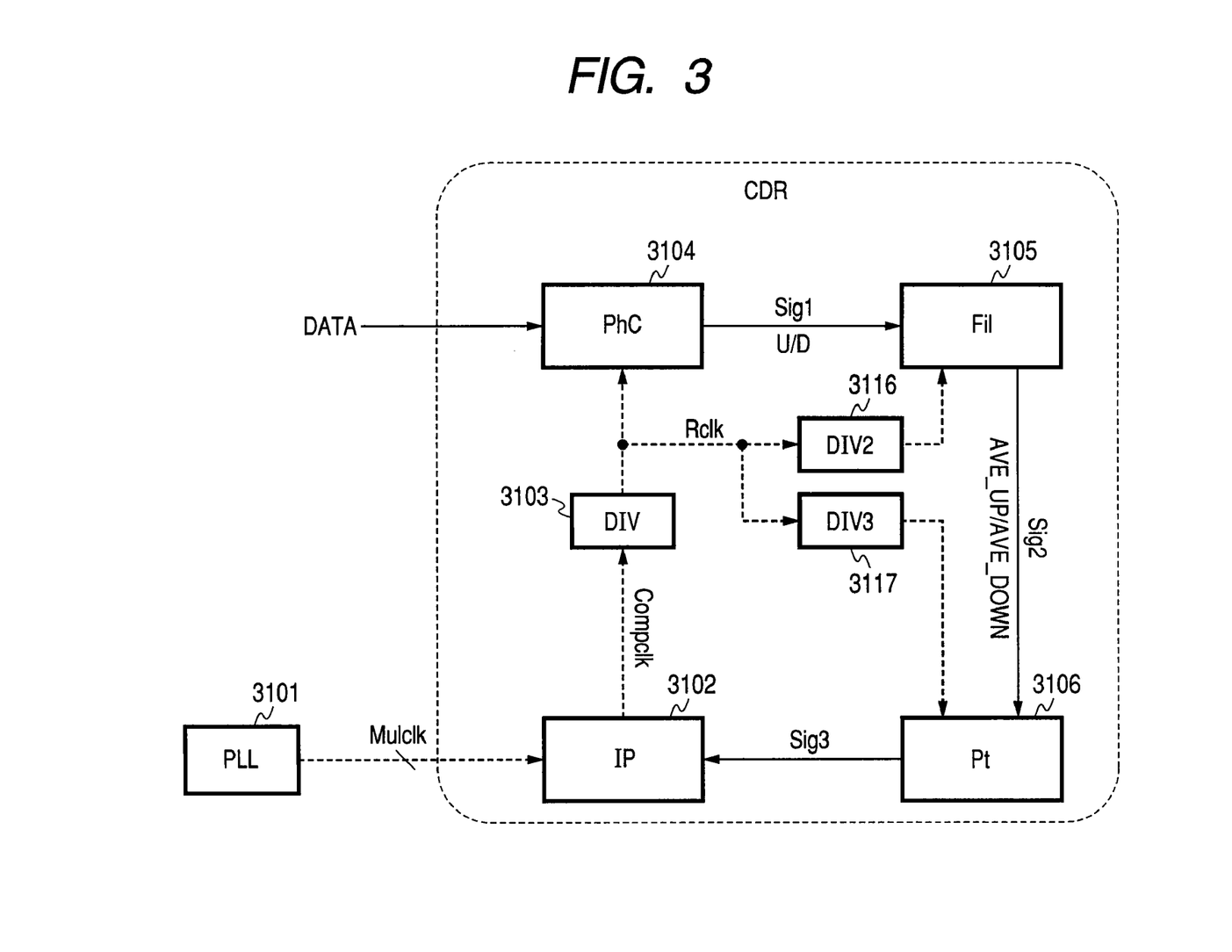
FIG. 3 is a diagram illustrating another example of the clock data recovery circuit corresponding to a multi-rate.

FIG. 3 is a block diagram illustrating another example of the clock data recovery circuit (CDR). The clock data recovery circuit shown in FIG. 3 differs from that shown in FIG. 2 in that a divider 3116 (DIV2) and a divider 3117 (DIV3) separately divide a recovery clock and supply the divided clocks to a filter 3105 (Fil) and a pointer 3106 (Pt), respectively. Therefore, it is possible to improve the phase followingness of the recovery clock of the clock data recovery circuit (CDR) with respect to input data.

FIG. 7 shows the waveforms of input data and a recovery clock when a data rate is 1/N. An interpolator 3102 (IP) operates at the same speed all the time regardless of the transmission rate of input data. Therefore, a phase correction amount capable of advancing or delaying the phase using a control signal both when the data rate is the highest and when the data rate is 1/N is T/S (see (a) and (b) of FIG. 7). However, as shown in (d) of FIG. 7, when the data rate is 1/N, the period of the recovery clock is N times longer than that of the composite clock, and a phase correction amount corresponding to one phase update cycle is N×T/S. That is, when the entire circuit is operated by the recovery clock, the following capability of the recovery clock with respect to input data (phase followingness) is 1/N if the data rate is 1/N. Therefore, the pointer 3106 and the filter 3105 are separately supplied with divided clocks. For example, a clock obtained by dividing the recovery clock by P (0<N<P) is supplied to the filter 3105, and a clock obtained by dividing the recovery clock by N/P is supplied to the pointer 3106 to operate the pointer 3106 at a speed that is N times higher than that of the filter 3105.

Then, the pointer transmits N control signals to the interpolator 3102 in response to one phase update signal transmitted from the filter 3105. In this way, as shown in (c) of FIG. 7, it is possible to achieve a clock data recovery circuit corresponding to a multi-rate in which a phase correction amount for one phase update cycle is N×T/S and the same phase followingness is obtained in the range of 0<N<P, regardless of a data rate.

Figure 4:
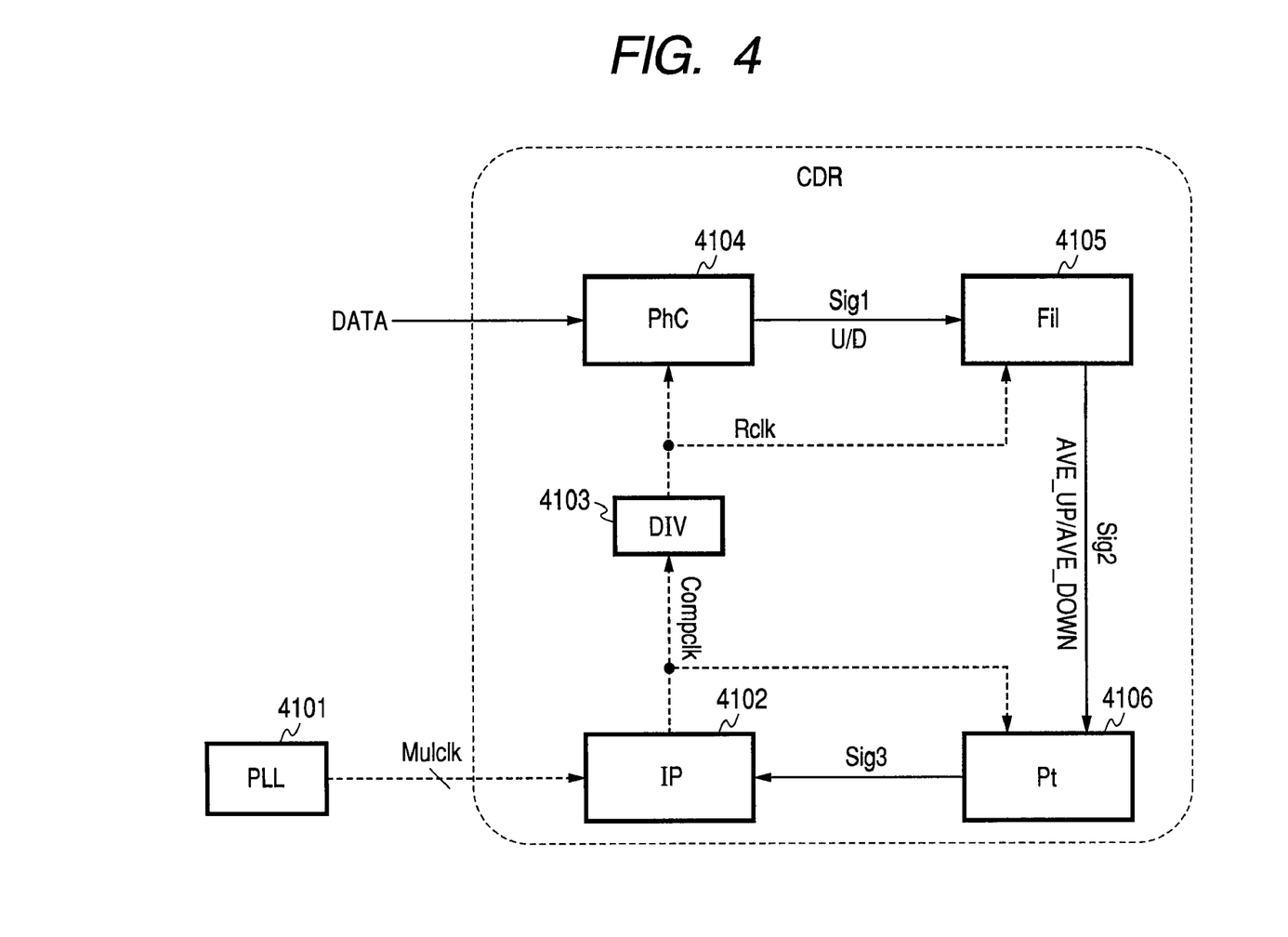
FIG. 4 is a diagram illustrating still another example of the clock data recovery circuit corresponding to a multi-rate.

FIG. 4 is a block diagram illustrating still another example of the clock data recovery circuit (CDR). The clock data recovery circuit shown in FIG. 4 differs from that shown in FIG. 2 in that the composite clock is supplied to the pointer 4106 before divided by the divider 4103. In this way, it is possible to improve the phase followingness of the recovery clock of the clock data recovery circuit with respect to input data.

When the data rate is 1/N, a filter 4105 is operated by the composite clock (recovery clock) that is divided by N by the divider 4103, and the pointer 4106 is operated by the composite clock before division. Therefore, similar to the circuit shown in FIG. 3, the pointer 4106 is operated at a speed that is N times higher than that of the filter 4105, and transmits N control signals to an interpolator 4102 in response to one phase update signal transmitted from the filter 4105. In this way, it is possible to achieve a clock data recovery circuit corresponding to a multi-rate in which a phase correction amount for one phase update cycle is N×T/S and the same phase followingness is obtained regardless of a data rate.

Figure 5:
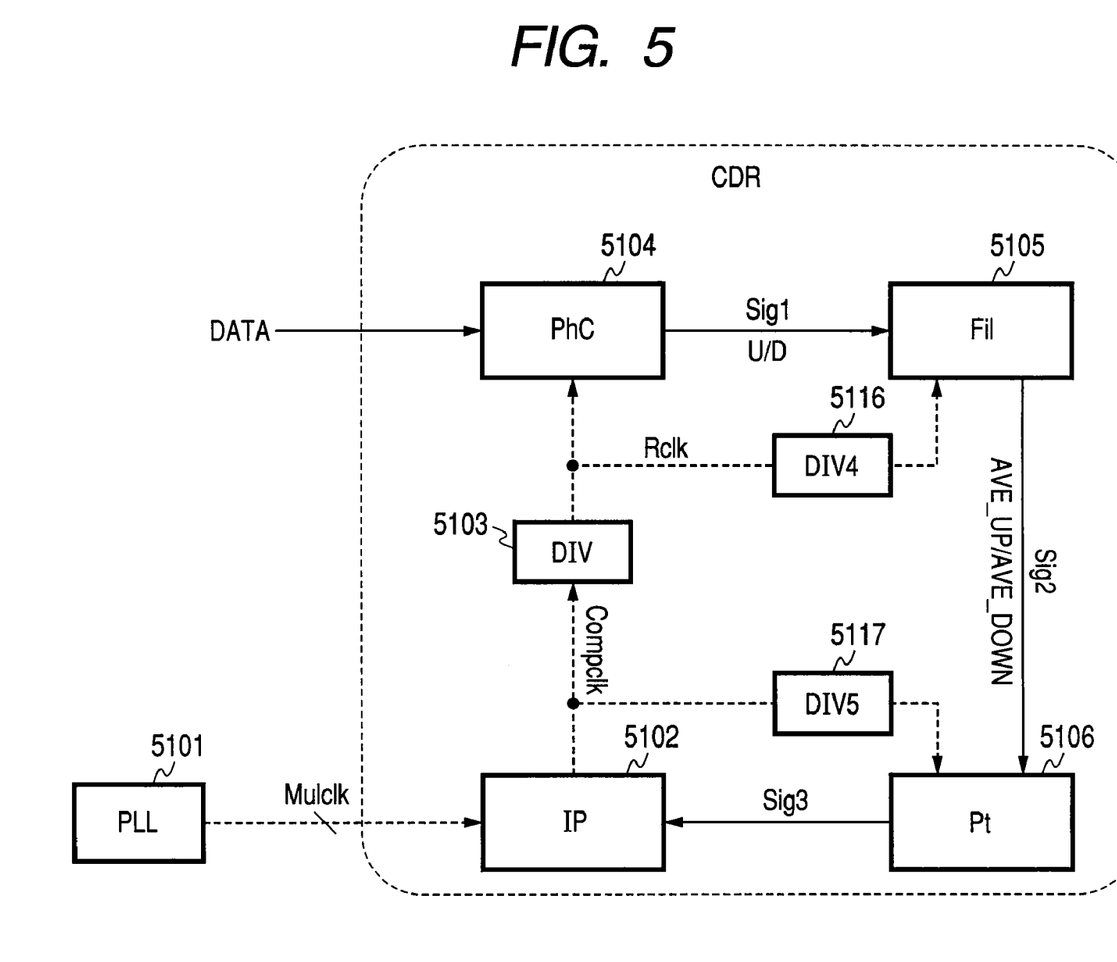
FIG. 5 is a diagram illustrating yet another example of the clock data recovery circuit corresponding to a multi-rate.

FIG. 5 is a block diagram illustrating yet another example of the clock data recovery circuit (CDR). A divider 5116 (DIV4) and a divider 5117 (DIV5) that divide clocks and respectively supply the divided clocks to a filter 5105 (Fil) and a pointer 5106 (Pt) are added to the circuit shown in FIG. 4. In this way, it is possible to improve a phase following capability while controlling the bandwidth of the clock data recovery circuit (CDR).

A clock obtained by dividing the recovery clock by P (P>0) (a clock obtained by dividing the composite clock of the interpolator by (N×P)) is supplied to the filter 5105 (Fil), and a clock obtained by dividing the composite clock of the interpolator by P is supplied to the pointer 5106 (Pt). The filter 5105 (Fil) can change the value of P to change a phase update cycle and control the bandwidth of the clock data recovery circuit (CDR). The pointer 5106 (Pt) can be operated at a speed that is N times higher than that of the filter 5105 (Fil). Similar to the circuit shown in FIG. 4, the pointer 5106 (Pt) can be operated at a speed that is N times higher than that of the filter 5105 (Fil) all the time. In addition, similar to the circuit shown in FIG. 4, the pointer can transmit N control signals to an interpolator 5102 in response to one phase update signal transmitted from the filter 5105. In this way, it is possible to achieve a clock data recovery circuit corresponding to a multi-rate having the same phase followingness regardless of a data rate.

As described above, according to this embodiment, it is possible to achieve a clock data recovery circuit corresponding to a multi-rate without increasing the bandwidth of an interpolator. Although the exemplary embodiment of the invention has been described above, the invention is not limited thereto, but various changes and modifications of the invention can be made without departing from the scope and spirit of the invention. For example, instead of the divider that is operated at an arbitrary division ratio, a combination of a divider that can select one or more fixed division ratios and a structure that changes the frequencies of multi-phase clocks within the range in which it is not necessary to change the bandwidth of an interpolator may be used. In addition, for example, when a phase comparator of a half rate type is used, it is possible to achieve a clock data recovery circuit corresponding to a multi-rate using a composite clock having a frequency that is half the frequency of input data (when a data rate is 1 gigabit/sec, a clock is 500 MHz).

The clock data recovery circuit according to the invention can be widely applied to a serial transmission system having plural transmission rates, such as a PON.

What is claimed is:

1. A semiconductor integrated circuit device comprising:
a phase locked loop;
an interpolator;
a first divider;
a pointer;
a phase comparator;
a filter;
a second divider; and
a third divider,
wherein the phase locked loop generates multi-phase clocks having the same frequency and different phases,
wherein the interpolator composes the multi-phase clocks to generate a composite clock having a phase that is designated by the pointer,
wherein the first divider divides the composite clock at a predetermined first division ratio to generate a first recovery cock,
wherein the phase comparator compares the phase of input data with the phase of the first recovery clock, outputs a phase delay signal when the phase of the first recovery clock lags the phase of the input data, and outputs a phase advance signal when the phase of the first recovery clock leads the phase of the input data,
wherein the pointer updates the phase in response to the phase delay signal or the phase advance signal, and designates the updated phase to the interpolator,
wherein the second divider divides the first recovery clock at a predetermined second division ratio to generate a second recovery clock,
wherein the third divider divides the first recovery clock at a predetermined third division ratio to generate a third recovery clock,
wherein the phase comparator operates using the first recovery clock as an operation clock,
wherein the filter operates using the second recovery clock as an operation clock, and
wherein the pointer operates using the third recovery clock as an operation clock.

2. A semiconductor integrated circuit device comprising:
a phase-locked loop;
an interpolator;
a first divider;
a pointer;
a phase comparator;
a filter;
a second divider; and
a third divider,
wherein the phase-locked loop generates multi-phase clocks having the same frequency and different phases,
wherein the interpolator composes the multi-phase clocks to generate a composite clock having a phase that is designated by the pointer,
wherein the first divider divides the composite clock at a predetermined first division ratio to generate a first recovery clock,
wherein the phase comparator compares the phase of input data with the phase of the first recovery clock, outputs a phase delay signal when the phase of the first recovery clock lags the phase of the input data, and outputs a phase advance signal when the phase of the first recovery clock leads the phase of the input data,
wherein the pointer updates the phase in response to the phase delay signal or the phase advance signal, and designates the updated phase to the interpolator,
wherein the second divider divides the first recovery clock at a predetermined second division ratio to generate a second recovery clock,
wherein the third divider divides the composite clock at a predetermined third division ratio to generate a third recovery clock,
wherein the phase comparator operates using the first recovery clock as an operation clock,
wherein the filter operates using the second recovery clock as an operation clock, and
wherein the pointer operates using the third recovery clock as an operation clock.

3. A semiconductor integrated circuit device comprising:
a phase-locked loop;
an interpolator;
a first divider;
a pointer;
a phase comparator; and
a filter,
wherein the phase-locked loop generates multi-phase clocks having the same frequency and different phases,
wherein the interpolator composes the multi-phase clocks to generate a composite clock having a phase that is designated by the pointer,
wherein the first divider divides the composite clock at a predetermined first division ratio to generate a first recovery clock,
wherein the phase comparator compares the phase of input data with the phase of the first recovery clock, outputs a phase delay signal when the phase of the first recovery clock lags the phase of the input data, and outputs a phase advance signal when the phase of the first recovery clock leads the phase of the input data,
wherein the pointer updates the phase in response to the phase delay signal or the phase advance signal, and designates the updated phase to the interpolator, and
wherein the filter counts the numbers of times the phase delay signal and the phase advance signal are asserted for a plurality of cycles, compares a difference between the numbers of times the phase delay signal and the phase advance signal are asserted with a predetermined threshold value, outputs the phase advance signal to the pointer when the difference is larger than a positive threshold value, and outputs the phase delay signal to the pointer when the difference is smaller than a negative threshold value.

4. A method for clock data recovery, comprising:
allowing a phase-locked loop to generate multi-phase clocks having the same frequency and different phases;
allowing an interpolator to compose the multi-phase clocks to generate a composite clock having a phase that is designated by the pointer;
allowing a first divider to divide the composite clock at a predetermined first division ratio to generate a first recovery clock;
allowing a phase comparator to compare the phase of input data with the phase of the first recovery clock, output a phase delay signal when the phase of the first recovery clock lags the phase of the input data, and outputs a phase advance signal when the phase of the first recovery clock leads the phase of the input data;

allowing a pointer to update the phase in response to the phase delay signal or the phase advance signal, and designate the updated phase to the interpolator;

allowing a second divider to divide the first recovery clock at a predetermined second division ratio to generate a second recovery clock; and allowing a third divider to divide the first recovery clock at a predetermined third division ratio to generate a third recovery clock, wherein the phase comparator operates using the first recovery clock as an operation clock, wherein the filter operates using the second recovery clock as an operation clock, and wherein the pointer operates using the third recovery clock as an operation clock.

5. A method for clock data recovery, comprising:

allowing a phase-locked loop to generate multi-phase clocks having the same frequency and different phases;

allowing an interpolator to compose the multi-phase clocks to generate a composite clock having a phase that is designated by the pointer;

allowing a first divider to divide the composite clock at a predetermined first division ratio to generate a first recovery clock;

allowing a phase comparator to compare the phase of input data with the phase of the first recovery clock, output a phase delay signal when the phase of the first recovery clock lags the phase of the input data, and outputs a phase advance signal when the phase the first recovery clock leads the phase of the input data;

allowing a pointer to update the phase in response to the phase delay signal or the phase advance signal, and designate the updated phase to the interpolator;

allowing a second divider to divide the first recovery clock at a predetermined second division ratio to generate a second recovery clock; and allowing a third divider to divide the composite clock at a predetermined third division ratio to generate a third recovery clock, wherein the phase comparator operates using the first recovery clock as an operation clock, wherein the filter operates using the second recovery clock as an operation clock, and wherein the pointer operates using the third recovery clock as an operation clock.

6. A method for clock data recovery, comprising:

allowing a phase-locked loop to generate multi-phase clocks having the same frequency and different phases;

allowing an interpolator to compose the multi-phase clocks to generate a composite clock having a phase that is designated by the pointer;

allowing a first divider to divide the composite clock at a predetermined first division ratio to generate a first recovery clock;

allowing a phase comparator to compare the phase of input data with the phase of the first recovery clock, output a phase delay signal when the phase of the first recovery clock lags the phase of the input data, and outputs a phase advance signal when the phase of the first recovery clock leads the phase of the input data;

allowing a pointer to update the phase in response to the phase delay signal or the phase advance signal, and designate the updated phase to the interpolator; and allowing a filter to count the numbers of times the phase delay signal and the phase advance signal are asserted for a plurality of cycles, compare a difference between the numbers of times the phase delay signal and the phase advance signal are asserted with a predetermined threshold value, output the phase advance signal to the pointer when the difference is larger than a positive threshold value, and output the phase delay signal to the pointer when the difference is smaller than a negative threshold value.

\* \* \* \* \*